(12) United States Patent
Wu et al.

(10) Patent No.: US 10,679,881 B2
(45) Date of Patent: Jun. 9, 2020

(54) OVERLAY MEASUREMENT METHOD AND APPARATUS

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Qiang Wu, Shanghai (CN); Xuan Liu, Shanghai (CN); Shifeng He, Shanghai (CN); Jianyao Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/797,966

(22) Filed: Oct. 30, 2017

(65) Prior Publication Data

US 2018/0122669 A1    May 3, 2018

(30) Foreign Application Priority Data

Oct. 31, 2016  (CN) .......................... 2016 1 0925864

(51) Int. Cl.
*H01L 21/67*  (2006.01)
*H01L 23/544*  (2006.01)
*G03F 7/20*  (2006.01)

(52) U.S. Cl.
CPC .... *H01L 21/67259* (2013.01); *G03F 7/70633* (2013.01); *H01L 23/544* (2013.01);
(Continued)

(58) Field of Classification Search
CPC ........... G03F 7/70633; H01L 21/67259; H01L 21/681; H01L 2223/54426; H01L 2223/5446

See application file for complete search history.

(56) References Cited

U.S. PATENT DOCUMENTS

| 6,079,256 A | 6/2000 | Bareket |
| 6,885,109 B2 * | 4/2005 | Yamaguchi .......... G01N 33/573 257/773 |

(Continued)

FOREIGN PATENT DOCUMENTS

EP    2458441    5/2012

OTHER PUBLICATIONS

European Application No. 17198879.3, Extended European Search Report dated May 29, 2018, 9 pages.

*Primary Examiner* — Violeta A Prieto
(74) *Attorney, Agent, or Firm* — Kilpatrick Townsend & Stockton LLP

(57) ABSTRACT

An apparatus for detecting a mark having first and second stripe groups on a substrate includes a detection module moveable over a surface of the substrate. The detection module includes a detection unit and a positioning unit configured to align the detection unit with the mark. The detection unit is configured to obtain data of the mark and operative to perform repeated acquisition operations on the first and second stripe groups of the mark. Each of the acquisition operations acquires data associated with the first stripe group or the second stripe group. The apparatus also includes a processing module configured to determine a (Continued)

positional deviation between the first stripe group and the second stripe group in response to the obtained data of the mark and data associated with a motion of the detection module.

21 Claims, 7 Drawing Sheets

(52) U.S. Cl.
CPC .............. *H01L 2223/5442* (2013.01); *H01L 2223/5446* (2013.01); *H01L 2223/54413* (2013.01); *H01L 2223/54426* (2013.01)

(56) References Cited

U.S. PATENT DOCUMENTS

| | | | |
|---|---|---|---|
| 2011/0273686 A1* | 11/2011 | Sato | G03B 27/42 355/53 |
| 2012/0133938 A1* | 5/2012 | Deckers | G03F 7/70625 356/388 |
| 2014/0340661 A1 | 11/2014 | Sato | |
| 2018/0122668 A1* | 5/2018 | He | H01L 21/681 |

* cited by examiner

OVERLAY MEASUREMENT METHOD AND APPARATUS

CROSS-REFERENCES TO RELATED APPLICATIONS

This application claims priority to Chinese patent application No. 201610925864.3, filed on Oct. 31, 2016, the content of which is incorporated herein by reference in its entirety.

FIELD OF THE INVENTION

The present invention relates generally to semiconductor technology. More particularly, embodiments of the present invention relate to an apparatus and method for detecting a mark on a substrate.

BACKGROUND OF THE INVENTION

Conventional overlay measurement devices rely on an optical imaging device to measure the relative positional deviation between two sets of marks. Since the lens of an optical imaging device may be distorted, it is generally necessary to first move the marks to the center of the field of view of the optical imaging device and then detect the relative positional deviation between the two sets of marks using image recognition techniques, thereby eliminating the effect of lens distortion on the measurement results.

FIGS. 1A and 1B are plan views of a schematic representation of two sets of marks at the center of the field of view of an optical imaging device, as known in the art. As shown in FIGS. 1A and 1B, the position of a mark 102A in the current layer in the X-direction and the position of an etched mark 102B in a previous layer in the Y-direction can be measured using image recognition techniques so that the relative deviation of the positions between the two sets of marks can be determined.

However, in the process of placing the marks to the center of the field of view of the optical imaging device, there may be an error due to the placement of the substrate on which the marks are disposed, therefore, it is generally necessary to fine tune the placement to place the marks to the center of the field of view, and the process is time consuming. Further, there is also a time required to identify the scanned image, so that it takes a relatively long time to measure a set of marks (e.g., 0.5-1 second).

With ever decreasing size in technology nodes, the requirement for the set of measurements also increase and more sets of marks need to be measured. For example, if more than 60 exposure areas of a wafer are required to be measured, and assuming that each exposure area has five sets of marks, the measurement time will take about 5 minutes.

Thus, there is a need for a novel measurement apparatus and method to reduce the measurement time of the marks.

BRIEF SUMMARY OF THE INVENTION

The present disclosure describes various embodiments that relate to devices, systems, and methods for cost effectively and time efficiently detecting marks on a substrate.

In one embodiment, an apparatus for detecting a plurality of marks on a substrate is provided. Each of the marks has a first stripe group and a second stripe group spaced apart from each other and disposed in parallel to each other. The apparatus includes at least one detection module moveable over a surface of the substrate along a first direction and having at least one detection unit configured to obtain data of a mark and operative to perform repeated acquisition operations on the first stripe group and the second stripe group of the mark, and at least one positioning unit configured to align the at least one detection unit with the mark in the first direction. Each of the acquisition operations acquires data associated with the first stripe group or the second stripe group of the mark. The apparatus also includes a processing module configured to determine a deviation between the first stripe group and the second stripe group in response to the obtained data of the mark and data associated with a motion of the at least one detection module.

In one embodiment, the first stripe group includes a plurality of the stripes, and the second stripe group includes a plurality of second stripes, and the first and second stripes are spaced apart from each other and disposed in parallel to each other along the first direction. The deviation between the first stripe group and the second stripe group includes a deviation between a first stripe of the first stripe group and a corresponding first stripe of the second stripe group, and an average value of the deviation between the first stripe of the first stripe group and the corresponding first stripe of the second stripe group. The processing module is further configured to determine the deviation between the first stripe group and the second stripe group in response to the deviation between the first stripe of the first stripe group and the corresponding first stripe of the second stripe group and the average value of the deviation between the first stripe of the first stripe group and the corresponding first stripe of the second stripe group.

In one embodiment, the first stripes and the second stripes are alternately arranged with each other.

In one embodiment, the obtained data of the mark includes a time at which the detection unit receives a peak light intensity associated with the first stripe group or the second stripe group of the mark; and the data associated with the motion of the detection module comprises a speed of the detection module, or a speed and an acceleration of the detection module.

In one embodiment, the substrate includes a plurality of columns of the marks arranged along the first direction. The at least one detection unit includes a plurality of detection units. The at least one positioning unit includes a plurality of positioning units, each of the positioning units is operative to align one of the detection units with a corresponding mark along the first direction.

In one embodiment, the at least one detection module further includes a frame. The at least one positioning unit includes at least one support rod mounted to the frame and configured to support the at least one detection unit; and a positioning mechanism configured to move the at least one detection unit along the at least one support rod to a desired position to align the at least one detection unit with a mark.

In one embodiment, the at least one support rod includes a screw rod, and the positioning mechanism moves the at least one detection unit along the screw rod.

In one embodiment, the at least one detection unit includes first and second holes arranged vertically with respect to each other and a third hole disposed between the first and second holes, the third hole having internal threads, and the screw bar having external threads for engaging the internal threads of the third hole. The frame includes a first bracket and a second bracket disposed opposite to each other. The at least one support rod includes a first support rail passing through the first hole and a second support rail passing through the second hole and suspended between the first and second brackets. The screw rod passing through the third hole drives the at least one detection unit along the first and second support rails when rotated.

In one embodiment, the apparatus further includes an air cushion guide. In one embodiment, the air cushion guide includes a first rail extending in the first direction, a first slider engaged with the first rail and configured to support the first bracket, a second rail extending in the first direction, and a second slider engaged with the second rail and configured to support the second bracket. The first slider, when moving along the first rail, drives the first bracket along the first direction and the second slider, when moving along the second rail, drives the second bracket along the first direction, so that the detection module moves above the surface of the substrate in the first direction.

In one embodiment, the frame further includes a third bracket engaged with a first end of the first bracket and a first end of second bracket; and a fourth bracket opposite the third bracket and engaged with a second end of the first bracket and a second end of the second bracket.

In one embodiment, the marks are disposed in a scribe line extending along the first direction and are configured such that, when a placement error of the substrate is a first error, and a misalignment of the a center of a field of view of the at least one detection unit with respect to an ideal center axis of the scribe line is a second error, the at least one detection unit is configured to obtain data from the marks disposed in the scribe line.

In one embodiment, the at least one detection unit includes an optical image detection system. In one embodiment, the optical image detection system includes a light source for generating light; a lens configured to converge the light generated by the light source to irradiate the marks; a semi-reflective mirror configured to reflect at least one portion of the converged light toward the lens to irradiate the marks and transmit at least one portion of light emitted by the irradiated marks through the lens; and a transducer configured to receive the emitted portion of the light by the irradiated marks through the lens and convert the received light into an electrical signal.

In one embodiment, the at least one detection unit includes an optical image detection system. The optical image detection system includes a lens for converging light emitted from the marks; a transducer for receiving light from the lens and converting the received light into an electrical signal; a light source for generating a first light beam and a second light beam; a first light generating member disposed on one side of the optical image detection system for generating a first light, and a second light generating member disposed on one side of the optical detection image system for generating a second light.

In one embodiment, the first light generating member includes a first mirror for reflecting the first light beam; a first lens for converging the first light beam reflected by the first mirror to generate a converged first light beam; a second mirror for reflecting the converged first light beam as the first light incident onto the mark at a first oblique angle. In one embodiment, the second light generating member includes a third mirror for reflecting the second light beam; a second lens for converging the second light beam reflected by the third mirror to generate a converged second light beam; and a fourth mirror for reflecting the converged second light beam as the second light incident onto the mark at a second oblique angle.

In one embodiment, the marks are etched marks, and the first stripe group comprises marks of a current layer, and the second stripe group comprises marks of a previous layer.

In one embodiment, the at least one detection module moves over the surface of the substrate at a nearly uniform deceleration. The processing module includes an actual time determination unit configured to determine actual times $t1i$ and $t2i$ when the detection module acquires data of an i-th stripe of the first stripes and the i-th stripe of the second stripes, respectively, i being an integer greater than or equal to one; a speed acquisition unit configured to acquire an initial speed $v0$ of the detection module; an acceleration determination unit configured to determine an acceleration a of the detection module; an ideal time determination unit configured to determine ideal times $t1pi$ and $t2pi$ when the detection module acquires data of the i-th stripe of the first stripes and the i-th stripe of the second stripes, respectively; and a deviation determination unit configured to determine a deviation between the first stripe group and the second stripe group in response to the determined actual time $t1i$ and $t2i$, the initial speed $v0$, the acceleration a, and the ideal times $t1pi$ and $t2pi$.

In one embodiment, the deviation determination unit is configured to determine: a difference $x1$ between an actual distance and an ideal distance from which the detection module moves from an initial position to the i-th stripe of the first stripes according to the actual time $t1i$, the initial speed $v0$, the acceleration a, and the ideal time $t1pi$; a difference $x2$ between an actual distance and an ideal distance from which the detection module moves from the initial position to the i-th stripe of the second stripes according to the actual time $t2i$, the initial speed $v0$, the acceleration a, and the ideal time $t2pi$; a difference $\Delta x$ between $x1$ and $x2$, the difference $\Delta x$ being the deviation between the first stripe group and the second stripe group.

In one embodiment, the at least one detection module moves over the surface of the substrate at a nearly uniform acceleration. The processing module includes an actual time determination unit configured to determine actual times $t1i$ and $t2i$ when the detection module acquires data of an i-th stripe of the first stripe group and the i-th stripe of the second stripe group, respectively, i being an integer greater than or equal to one; a speed acquisition unit configured to acquire a speed $v0$ of the detection module; an ideal time determination unit configured to determine ideal times $t1pi$ and $t2pi$ when the detection module acquires data of the i-th stripe of the first stripes and the i-th stripe of the second stripes, respectively; a deviation determination unit configured to determine a deviation between the first stripe group and the second stripe group in response to the determined actual time $t1i$ and $t2i$, the initial speed $v0$, and the ideal times $t1pi$ and $t2pi$.

In one embodiment, the deviation determination unit is configured to determine: a difference $x1$ between an actual distance and an ideal distance from which the detection module moves from an initial position to the i-th stripe of the first stripe group according to the actual time $t1i$, the initial speed $v0$, and the ideal time $t1pi$; a difference $x2$ between an actual distance and an ideal distance from which the detection module moves from an initial position to the i-th stripe of the second stripe group according to the actual time $t2i$, the initial speed $v0$, and the ideal time $t2pi$; a difference $\Delta x$ between $x1$ and $x2$, the difference $\Delta x$ being the deviation between the first stripe group and the second stripe group.

Embodiments of the present disclosure also provide a method for detecting a mark on a substrate, the mark includes a first stripe group having a plurality of stripes and a second stripe group having a plurality of stripes arranged in parallel to each other. In one embodiment, the method may include providing the substrate having a plurality of layers; providing a detection module having a detection unit and a positioning unit disposed over a surface of the substrate, the detection module configured to move over the surface of the substrate in a first direction to obtain data of the mark and perform repeated acquisition operations on a stripe of the first group or on a stripe of the second group to obtain data thereof; aligning the detection unit with the mark by the positioning unit; operating the detection module to obtain data of the mark; and determining a deviation between the first stripe group and the second stripe group by a processing module in response to the obtained data from the mark and data associated with a motion of the detection module.

In one embodiment, the mark is formed in the substrate, the stripes of the first stripe group are disposed on a current layer and the stripes of the second stripe group are disposed on a previous layer.

In one embodiment, the processing module comprises an actual time determination unit, a speed determination unit, an acceleration determination unit, an ideal time determination unit, and a deviation determination unit. The method further includes moving the detection module over the surface of the substrate at a nearly uniform deceleration; determining actual times $t1i$ and $t2i$ by the actual time determination unit associated with data obtained of an i-th stripe of the first stripe group and an i-th stripe of the second stripe group, respectively; determining an initial speed $v0$ of the detection module by the speed determination unit; determining an acceleration a of the detection module by the acceleration determination unit; determine ideal times $t1pi$ and $t2pi$ associated with data of the i-th stripe of the first stripe group and the i-th stripe of the second stripe group by the ideal time determination unit; and determining the deviation between the first stripe group and the second stripe group in response to the determined actual time $t1i$ and $t2i$, the initial speed $v0$, the acceleration a, and the ideal times $t1pi$ and $t2pi$ by the deviation determination unit. The index i is an integer greater than or equal 1.

In one embodiment, determining the deviation between the first stripe group and the second stripe group includes determining a difference x1 between a first actual distance and a first ideal distance from which the detection module moves from an initial position to the i-th stripe of the first stripe group according to the actual time $t1i$, the initial speed $v0$, the acceleration a, and the ideal time $t1pi$; determining a difference x2 between a second actual distance and a second ideal distance from which the detection module moves from the initial position to the i-th stripe of the second stripe group according to the actual time $t2i$, the initial speed $v0$, the acceleration a, and the ideal time $t2pi$; and determining a difference $\Delta x$ between x1 and x2, the difference $\Delta x$ being the deviation between the first stripe group and the second stripe group.

In one embodiment, the processing module includes an actual time determination unit, a speed determination unit, an ideal time determination unit, and a deviation determination unit. The method further includes moving the detection module over the surface of the substrate at a nearly uniform acceleration; determining actual times $t1i$ and $t2i$ by the actual time determination unit associated with data obtained of an i-th stripe of the first stripe group and an i-th stripe of the second stripe group, respectively; determining a speed $v0$ of the detection module by the speed determination unit; determining ideal times $t1pi$ and $t2pi$ associated with data of the i-th stripe of the first stripe group and the i-th stripe of the second stripe group by the ideal time determination unit; and determining the deviation between the first stripe group and the second stripe group in response to the determined actual time $t1i$ and $t2i$, the speed $v0$, and the ideal times $t1pi$ and $t2pi$ by the deviation determination unit, wherein the index i is an integer greater than or equal to 1.

In one embodiment, determining the deviation between the first stripe group and the second stripe group includes determining a difference x1 between a first actual distance and a first ideal distance from which the detection module moves from an initial position to the i-th stripe of the first stripes according to the actual time $t1i$, the initial speed $v0$, and the ideal time $t1pi$; determining a difference x2 between a second actual distance and a second ideal distance from which the detection module moves from the initial position to the i-th stripe of the second stripes according to the actual time $t2i$, the initial speed $v0$, and the ideal time $t2pi$; and determining a difference $\Delta x$ between x1 and x2, the difference $\Delta x$ being the deviation between the first stripe group and the second stripe group.

According to embodiments of the present disclosure, the detection unit can be substantially aligned with a corresponding to be detected mark by the positioning unit, the detection module is driven to move over the surface of the substrate to detect a corresponding mark and to determine the positional deviation between the first and second stripe groups based on data associated with the mark and data associated with the motion of the detection module. The processing module determines the deviation between the first and second stripe groups based on the obtained data of the marks and the data associated with the motion of the detection module.

Embodiments of the present disclosure also provide a method for detecting a mark on a substrate, the mark comprising a first stripe group having a plurality of stripes and a second stripe group having a plurality of stripes arranged in parallel to each other. The method may include providing the substrate having a plurality of layers; providing at least one detection module having a detection unit and a positioning unit disposed over a surface of the substrate, the at least one detection module being configured to move over the surface of the substrate in a first direction to obtain data of the mark and perform repeated acquisition operations on a stripe of the first group or on a stripe of the second group to obtain data thereof; aligning the detection unit with the mark by the positioning unit; operating the detection module to obtain data of the mark; and determining a deviation between the first stripe group or the second stripe group in response to the obtained data of the mark and data associated with a motion of the detection module.

In one embodiment, the mark is formed in the substrate, the stripes of the first stripe group are disposed on a current layer and the stripes of the second stripe group are disposed on a previous layer.

In one embodiment, the method may further include moving the detection module over the surface of the substrate at a uniform deceleration; determining actual times $t1i$ and $t2i$ associated with data obtained of an i-th stripe of the first stripe group and an i-th stripe of the second stripe group, respectively; determining an initial speed $v0$ of the detection module; determining an acceleration a of the detection module; determine ideal times $t1pi$ and $t2pi$ associated with data of the i-th stripe of the first stripe group and the i-th stripe of the second stripe group; and determining the deviation between the first stripe group and the second stripe group in response to the determined actual time $t1i$ and $t2i$, the initial speed $v0$, the acceleration a, and the ideal times $t1pi$ and $t2pi$, wherein i is an integer greater than or equal 1.

In one embodiment, determining the deviation between the first stripe group and the second stripe group includes determining a difference x1 between a first actual distance and a first ideal distance from which the detection module moves from an initial position to the i-th stripe of the first stripe group according to the actual time t1$i$, the initial speed v0, the acceleration a, and the ideal time t1$pi$; determining a difference x2 between a second actual distance and a second ideal distance from which the detection module moves from the initial position to the i-th stripe of the second stripe group according to the actual time t2$i$, the initial speed v0, the acceleration a, and the ideal time t2$pi$; and determining a difference Δx between x1 and x2, the difference Δx being the deviation between the first stripe group and the second stripe group.

In one embodiment, the method further includes moving the detection module over the surface of the substrate at a uniform acceleration; determining actual times t1$i$ and t2$i$ by the actual time determination unit associated with data obtained of an i-th stripe of the first stripe group and an i-th stripe of the second stripe group, respectively; determining a speed v0 of the detection module; determining ideal times t1$pi$ and t2$pi$ associated with data of the i-th stripe of the first stripe group and the i-th stripe of the second stripe group; and determining the deviation between the first stripe group and the second stripe group in response to the determined actual time t1$i$ and t2$i$, the speed v0, and the ideal times t1$pi$ and t2$pi$, wherein i is an integer greater than or equal to 1.

In one embodiment, determining the deviation between the first stripe group and the second stripe group includes determining a difference x1 between a first actual distance and a first ideal distance from which the detection module moves from an initial position to the i-th stripe of the first stripe group according to the actual time t1$i$, the initial speed v0, and the ideal time t1$pi$; determining a difference x2 between a second actual distance and a second ideal distance from which the detection module moves from the initial position to the i-th stripe of the second stripe group according to the actual time t2$i$, the initial speed v0, and the ideal time t2$pi$; and determining a difference Δx between x1 and x2, the difference Δx being the deviation between the first stripe group and the second stripe group.

Embodiments of the present disclosure further provide another method for detecting a plurality of marks on a substrate, where each mark includes a first stripe group having a plurality of stripes and a second stripe group having a plurality of stripes arranged in parallel to each other. The method may include providing the substrate; providing a plurality of first detection modules each having a first detection unit and a first positioning unit disposed over a surface of the substrate, the first detection modules being configured to move over the surface of the substrate in a first direction to obtain data of marks in first scribe lines in the first direction, the second detection modules being configured to move over the surface of the substrate in a second direction to obtain data of marks in second scribe lines in the second direction, the first and second directions being perpendicular to each other; aligning the first detection units with the marks in the first direction by the first positioning units; operating the first detection module to obtain data of the marks in the first direction; and determining a deviation between the first stripe group or the second stripe group of a mark in the first scribe lines in response to the obtained data of the marks and data associated with a motion of the first detection modules.

In one embodiment, the method may further include providing a plurality of second detection modules each having a second detection unit and a second positioning unit disposed over the surface of the substrate, the second detection modules being disposed on top of the first detection modules and configured to move over the surface of the substrate in a second direction to obtain data of marks in second scribe lines in the second direction perpendicular to the first direction; aligning the second detection units with the marks in the second direction by the second positioning units; operating the second detection module to obtain data of the marks in the second direction; and determining a deviation between the first stripe group or the second stripe group of a mark in the second scribe lines in response to the obtained data of the marks and data associated with a motion of the first detection modules.

In one embodiment, the first detection modules obtain data of marks in the first scribe lines in a single first scan, and the second detection modules obtain data of marks in the second scribe lines in a single second scan.

The apparatus and method for detecting a mark according to embodiments of the present disclosure does not depend on the way the marks are detected, so that there is no need to move the mark to the center of the field of view of the optical imaging system, there is no need for a fine adjustment operation, and there is no need to identify the optical image, there is no need to determine the exact location of the marks, thereby reducing the mark detection time. The apparatus and method of the present disclosure also eliminate the high precise alignment accuracy required in the prior art. Thus, the mark detection cost is reduced, and the efficiency of the mark detection and the throughput of the detection device are greatly improved.

The following description, together with the accompanying drawings, will provide a better understanding of the nature and advantages of the claimed invention.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

Figure 1A:
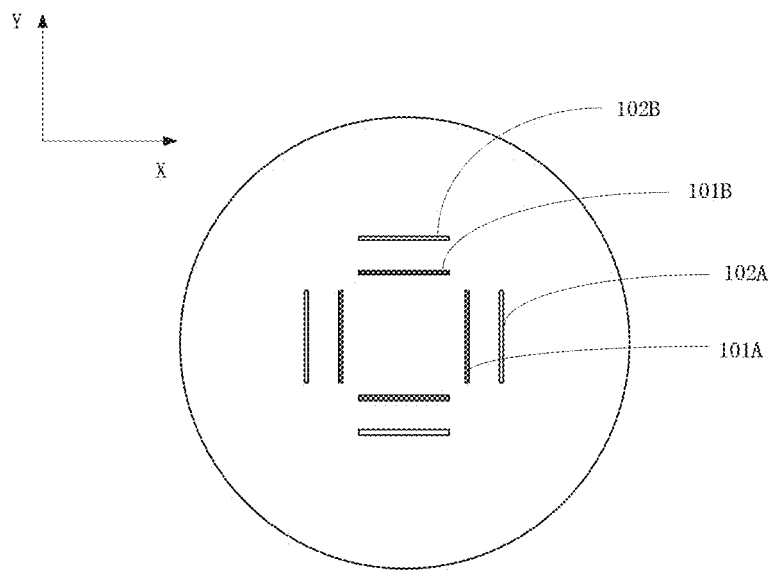
FIGS. 1A and 1B are plan views of a schematic representation of two sets of marks at the center of the field of view of an optical imaging device, as known in the art.
Figure 1B:
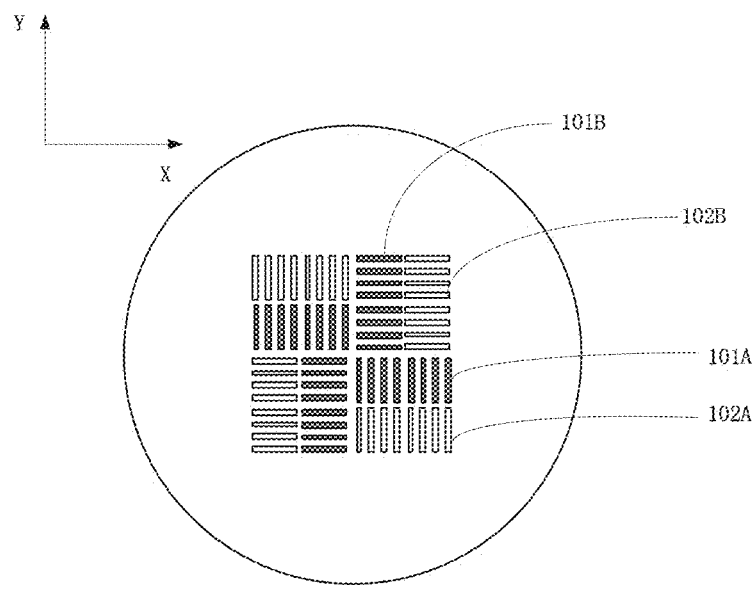

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments and intermediate structures) of the invention.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It should be noted that the reference numerals and letters denoted similar items in the accompanying drawings, and therefore, once an item is defined in a drawing, its description will not be repeated in drawings that follow.

Embodiments of the present disclosure provide a method for detecting marks without relying upon an optical imaging device that performs an imaging operation of the marls. In this way, the requirement on the lens is relatively low, and a conventional optical detection system can be used to detect the marks. The method according to embodiment of the present disclosure not only reduces the detection time of the marks, but also lowers the cost of test equipment (e.g., marking device).

Figure 2:
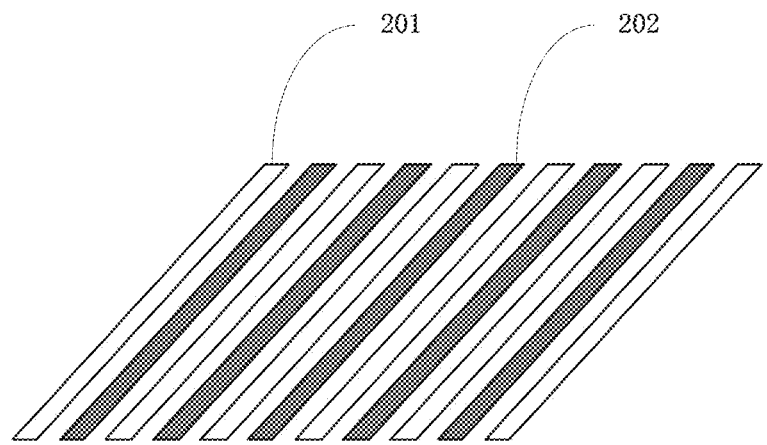
FIG. 2 is a perspective view illustrating a mark on a substrate according to one embodiment of the present disclosure.

FIG. 2 is a perspective view of a mark on a substrate according to one embodiment of the present disclosure. As shown in FIG. 2, the mark on the substrate may include a plurality of first stripes (first stripe group) 201 and a plurality of second stripes (second stripe group) 202 that are substantially parallel to each other and spaced apart from each other. In one embodiment, first stripes 201 may be the marking stripes of the current layer, and second stripes 202 may be the marking stripes of a previous layer. That is, first stripes 201 may be formed in a first layer, and second stripes 202 may be formed in a second layer that is different from the first layer. Thus, it is understood that, although the first and second stripes are shown to be substantially flush for the convenience of illustration in FIG. 2, the first and second stripes can be disposed in different levels according to certain embodiments. Illustratively, first stripes 201 and second stripes 202 may be a concave-convex pattern formed in corresponding layers. Further, in some embodiments, the first and second stripes may be configured to have different properties. In one example embodiment, the first and second stripes may be configured to have different surface reflectivity, such that one of the first and second stripes has a relatively smooth surface and the other one of the first and second stripes has a relatively rough surface. In another example embodiment, the first and second stripes may be configured to have different surface heights. It is to be understood that these are merely examples in order to better understand the various embodiments of the disclosure and are not intended to limit the scope of the disclosure, as long as the difference between the first and second stripes is distinguishable using any technical means (e.g., through information or data obtained from the stripes). In some other embodiments, the mark on the substrate may include a first group of stripes (a first stripe group) spaced apart from each other and a second group of stripes (a second stripe group) spaced apart from each other, as shown in FIG. 2. Herein, the first group of stripes (the first stripe group) may include a plurality of first stripes adjacent to each other, and the second group of stripes (the second stripe group) may include a plurality of second stripes adjacent to each other. The first group of stripes and the second group of stripes are arranged parallel to each other along a certain direction. In one embodiment, first stripes 201 and second stripes 202 are disposed alternatively to each other (as shown in FIG. 2), however, the present disclosure is not limited thereto.

Figure 3:
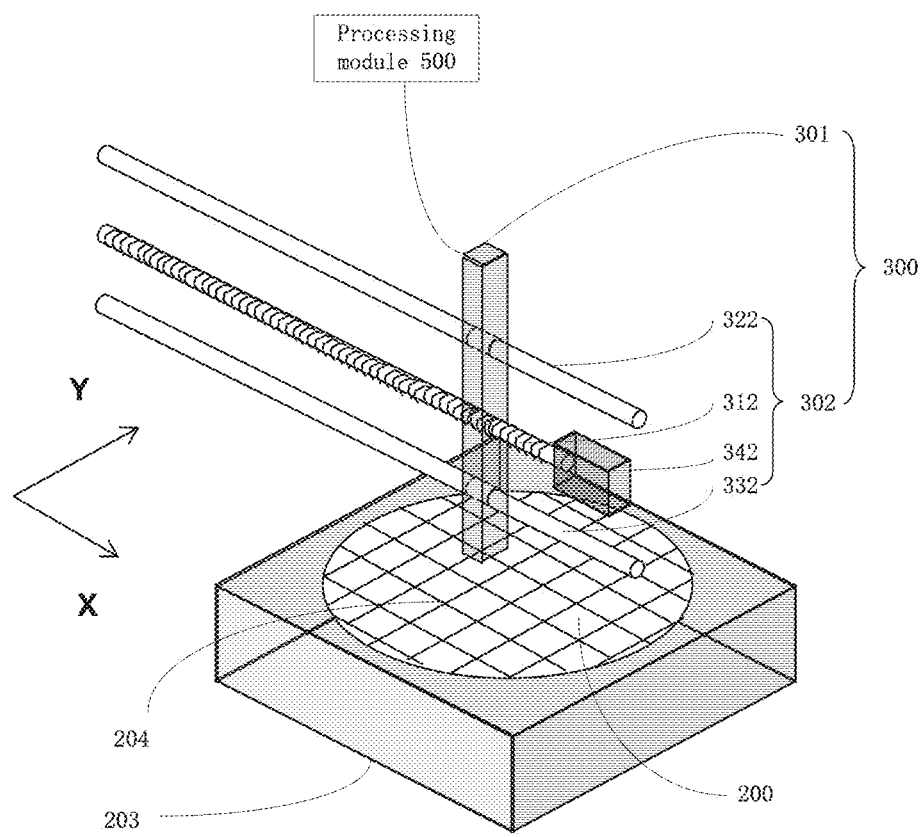
FIG. 3 is a perspective view illustrating a structure of an apparatus for detecting a mark on a substrate according to one embodiment of the present disclosure.

FIG. 3 is a perspective view illustrating a structure of an apparatus for detecting a mark on a substrate 200 according to an embodiment of the present disclosure. For the sake of convenience of description, the term "an apparatus for detecting a mark on a substrate" is alternatively referred to as "a detection apparatus" or "a detection device" hereinafter. The mark on the surface of substrate 200 may include the stripes described above. Referring to FIG. 3, the detection apparatus (detection device) may include at least one detection module 300 and a processing module 500. Detection module 300 is configured to be moveable over the surface of substrate 200 along at least one direction (e.g., along the Y-direction). In some embodiments, the detection apparatus may include two detection modules, one of which is configured to be moveable over the surface of substrate 200 along the X-direction, the other one is configured to be moveable over the surface of substrate 200 along the Y-direction. Substrate 200 is shown as being supported by a substrate support platform 203. Substrate support platform 203 may be any suitable platform for supporting or carrying a substrate known in the art or developed in the future.

Detection module 300 may include at least one detection unit 301 and at least one positioning unit 302. Detection unit 301 is configured to obtain information (data) of a corresponding mark (e.g., as shown in FIG. 2). In the example embodiment shown in FIG. 3, one or more marks may be disposed in a track 204. Track 204 may be a scribe line of a semiconductor wafer, the mark may be an alignment mark imprinted on or etched in the scribe line. Track 204 is shown to be extending along the X-direction and/or the Y-direction. It should be understood that track 204 is merely an example, those of skill in the art will appreciate that track 204 may not be present or a virtual straight line.

Detection unit 301 is configured to perform repeated acquisition operations on a first stripe group (i.e., first stripes 201) and a second stripe group (i.e., second stripes 202) of a corresponding mark. Each acquisition operation may obtain information (data) of the first stripe group or the second stripe group of the corresponding mark.

Positioning unit 302 is configured to support and position a corresponding detection unit 301. Positioning unit 302 is configured to operate such that corresponding detection unit 301 is substantially aligned with a corresponding alignment mark in the X or Y direction of the detection module. Positioning unit 302 will be described in more detail later below.

Processing module 500 may be connected to detection module 300 through a wired or a wireless connection link. Processing module 500 is configured to determine a positional deviation between the first and second stripes based on the obtained data of the mark and motion data associated with the motion of detection module 300. In one embodiment, the obtained data of the mark may include at least one of the peak light intensity received from the first stripe group or the second stripe group and the time at which the peak light intensity is received. In one embodiment, the motion data may include the motion speed and acceleration of detection module 300. In one embodiment, processing module 500 may be integrated in the detection device (e.g., in the form of a processor). In another embodiment, processing module 500 may be an individual component, such as a computing device remote from the detection module and connected to the detection module through a wired or wireless communication link.

According to the present disclosure, the detection unit may be substantially aligned with a corresponding mark to be detected by the positioning unit so that the detection module moves above the substrate using the detection unit to obtain data of a corresponding mark, and the processing module determines the positional deviation between the first and second stripe groups based on the obtained mark data and the motion data associated with the motion of the detection module. The method for detecting the mark does not depend from an optical imaging approach, and thus, there is no need to move the mark to the center of the field of view of the optical imaging system, there is no need for a fine tuning operation, and there is no need to identify the optical image, which reduces the detection time of the mark, and there is no need for a high precise alignment accuracy required in the prior art. Thus, the cost of mark detection is reduced, and the efficiency of the mark detection and the throughput of the detection apparatus are improved.

Figure 4:
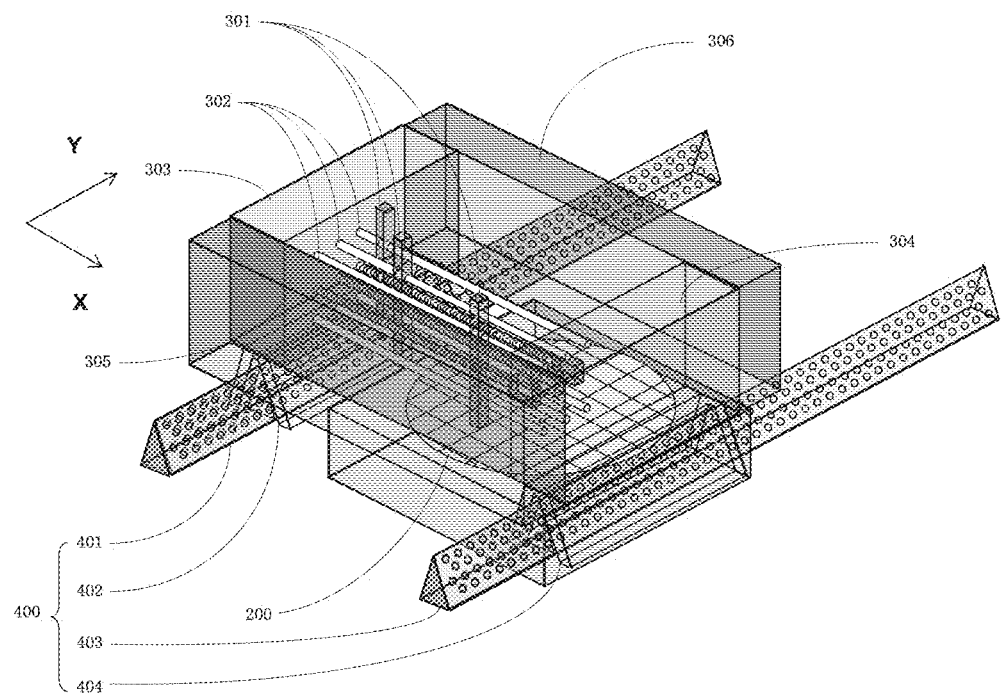
FIG. 4 is a perspective view illustrating a structure of an apparatus for detecting a mark on a substrate according to another embodiment of the present disclosure.

FIG. 4 is a perspective view illustrating a structure of an apparatus for detecting a mark on a substrate according to another embodiment of the present disclosure. In the embodiment, substrate 200 may include a plurality of columns of marks arranged along a certain position (e.g., the Y direction). Each column of marks may include a plurality of first stripes 201 that are arranged in parallel and spaced apart from each other and a plurality of second stripes 202 that are arranged in parallel and spaced apart from each other (as shown in FIG. 2). Detection module 300 may include a plurality of detection units 301 and a plurality of positioning units 302. Each positioning unit 302 is operative to align a corresponding detection unit 301 with a corresponding mark along the direction of motion of the detection unit/module (e.g., in the Y direction as shown in FIG. 4).

In the embodiment, the detection unit may be aligned with a column of marks by the positioning unit so that detection module 300 can detect multiple columns of marks when moving over the surface of the substrate along the Y direction to further reduce the detection time and improve the detection efficiency.

It is understood that, although three detection units 301 and three positioning units 302 are shown in FIG. 4, this is merely illustrative and is not intended to limit the scope of the present disclosure. In practical applications, the number of detection units and positioning units can be determined according to actual requirements.

The detection apparatus may include a plurality of detection modules, for example, two detection modules. One of the detection modules is operative to detect one or more marks in a certain direction (e.g., the Y direction), and the another one of the detection modules is operative to detect one or more marks in another direction (e.g., the X direction). In the case where a plurality of columns of marks are arranged in both the X direction and the Y direction, one scanning operation in the X direction may detect all of the marks arranged in the X direction, and one scanning operation in the Y direction may detect all of the marks arranged in the Y direction. If the scanning speed is 1 m/s, the time to scan a 300 mm substrate is only slightly greater than 0.3 seconds. The time to completely scan the marks arranged in both X and Y directions is about 1 second, thus, the time of detecting all the marks of the substrate is greatly reduced.

In one embodiment, referring to FIG. 4, detection module 300 may also include a frame. The detection unit and the positioning unit may be directly or indirectly mounted on or supported by the frame. In one embodiment, the frame may include a first bracket 303 and a second bracket 304 disposed opposite to each other. In another embodiment, the frame may include first bracket 303, second bracket 304, a third bracket 305, and a fourth bracket 306. Third bracket 305 and fourth bracket 306 are disposed opposite to each other and arranged in a certain direction (e.g., the Y direction). Third bracket 305 is engaged with a first end of first bracket 303 and a first end of second bracket 304, and fourth bracket 306 is engaged with a second end of first bracket 303 and a second end of second bracket 304. The first ends and the second ends of the first and second brackets are opposite to each other. The frame is configured to increase the weight of the detection device, thereby increasing the inertia of the detection device in motion, and to secure the positioning unit to a support rod (that will described in detail later below).

Referring still to FIG. 4, the detection device may also include an air cushion guide 400. Air cushion guide 400 may include a first rail 401, a first slider 402, a second rail 403, and a second slider 404. First rail 401 and second rail 402 extend in the same direction (e.g., the Y direction). First slider 402 is engaged with first rail 401 (e.g., disposed on first rail 401) to support first bracket 303. Second slider 404 is engaged with second rail 403 (e.g., disposed on second rail 403) to support second bracket 304. First slider 402 and second slider 404 are configured to slide along first rail 401 and second rail 402. When first slider 402 and second slider 404 are driven to slide along first rail 401 and second rail 402, they move first bracket 303 and second bracket 304 in a certain direction (e.g., the Y direction) so that detection module 300 can move over the surface of substrate 200 in the certain direction and detect marks disposed in that direction. In one embodiment, detection module 300 is operative to move with a uniform acceleration and a uniform deceleration.

Figure 5:
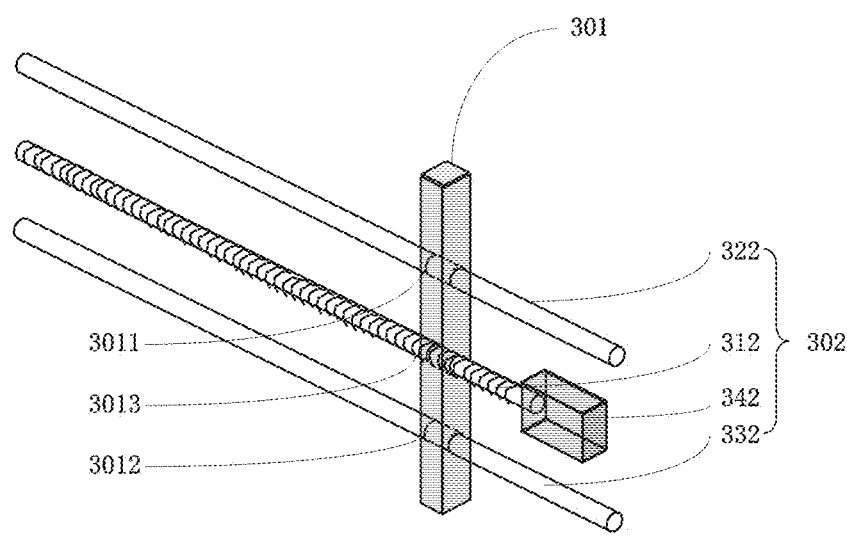
FIG. 5 is a perspective view illustrating a structure of a detection unit and a positioning unit according to one embodiment of the present disclosure.

FIG. 5 is a perspective view illustrating a structure of a detection unit and a positioning unit according to one embodiment of the present disclosure. Referring to FIG. 5, positioning unit 302 may include at least one support rod and a positioning mechanism 342. The support rod may be mounted or partially mounted on the frame (e.g., on the first bracket and/or the second bracket) and configured to support a corresponding detection unit 301. Positioning mechanism 342 is configured to move corresponding detection unit 301 along the support rod that secures the detection unit in a desired position so that the detection unit is aligned with a corresponding mark in a certain direction (e.g., the Y direction). In one embodiment, the support rod may include a screw rod 312, and positioning mechanism 342 may be driven by screw rod 312 to move detection unit 301 along screw rod 312. In one embodiment, positioning mechanism 342 may be a rotating motor that can drive the screw rod to properly position detection unit 301.

In practical applications, the detection unit and the positioning unit may be implemented using different approaches so that the positioning unit can cause the corresponding detection unit to be aligned with a corresponding mark in a certain direction (e.g., the Y direction).

In one embodiment, detection unit 301 may include a first hole 3011 disposed in a first vertical position and a second hole 3012 disposed in a second vertical position, and a third hole 3013 disposed between first hole 3011 and second hole 3012 as shown in FIG. 5. Third hole 3013 has an internal thread, and screw rod 312 has an external thread engaging the internal thread of third hole 3013. In the embodiment, the frame may include first bracket 303 and second bracket 304 opposite to each other (shown in FIG. 4). The support rod may include screw rod 312, a first support rail 322, a second support rail 332, and positioning mechanism 342. First support rail 322 and second support rail 332 pass through respective first hole 3011 and second hole 3012 and suspended between first bracket 303 and second bracket 304. In one embodiment, first support rail 322 and second support rail 332 may be engaged with detection unit 301 using a sliding bearing so that detection unit 301 can be moved along the support rails. Screw rod 312 passes through third hole 3013 so as to enable detection unit 301 to move along first support rail 322 and second support rail 332 when screw rod 312 is rotated to cause detection unit 301 to align with a corresponding mark in a certain direction (e.g., the Y direction).

Figure 6:
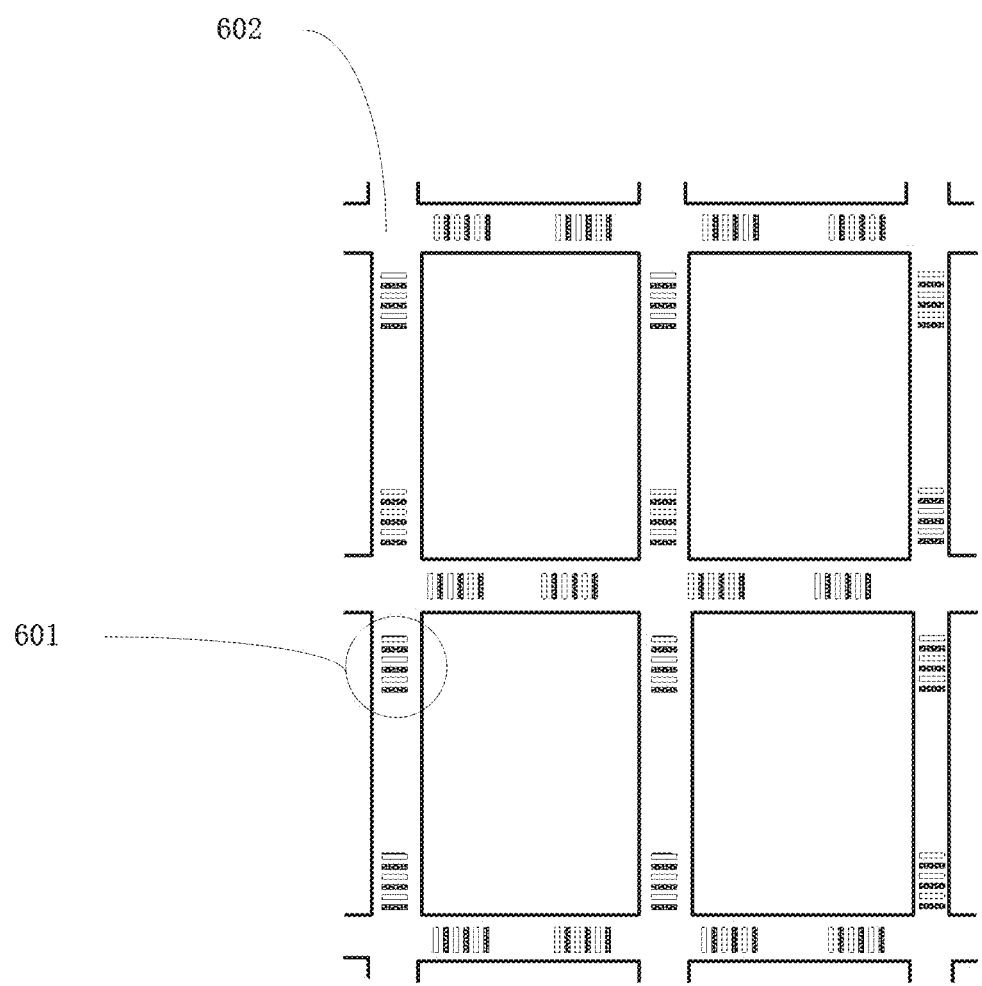
FIG. 6 is a plan view of a set of marks in a scribe line according to one embodiment of the present disclosure.

FIG. 6 is a plan view of one or more marks 601 disposed in a scribe line according to one embodiment of the present disclosure. Referring to FIG. 6, one or more marks 601 may be provided on a substrate such as in a scribe line 602 in the Y direction. Scribe line 602 may extend along the X direction and/or the Y direction. Marks 601 may be any of the above-described marks, e.g., each of the marks may include the first stripe group having a plurality of first stripes and the second stripe group having a plurality of second stripes shown in FIG. 2. In the embodiment, each mark 601 may be configured such that, when a placement error of the substrate is a first error, and a misalignment error of the center of the field of view of the detection unit with respect to the ideal center axis of scribe line 602 is a second error, the detection unit is operative to obtain data from the marks disposed in the scribe line. It is appreciated that, marks 601 may include a plurality of marks disposed in the Y direction or in the X direction, and each of the marks may include the first stripe group and the second stripe group.

In one exemplary embodiment, the scribe line has a width of 70 μm, the substrate placement error is 15 μm, the adjustment accuracy of the screw rod is 10 μm, the width of the field of view is 20 μm, the width of the mark may be set in the range between 40 μm and 70 μm. In this way, when the detection apparatus is operative to detect the mark, only the detection unit is positioned within the adjustment accuracy error, and all the marks in a corresponding scribe line can be detected in one scanning operation. Thus, it is only necessary to perform a relatively coarse alignment to carry out efficient measurements without the need for precise alignment as required in the prior art approach, thereby greatly reducing the mark detection time, improving the detection efficiency and reducing the equipment accuracy requirement to lower the equipment cost.

With regard to the marks, some of the marks may have defects, e.g., undesirable particles or dust are present on the surface of the marks. In practical applications, the detection apparatus may be equipped with different types of detection units to detect defects of the marks or to prevent adverse effects of the mark defects on the detection. As an example, two structures of the detection unit will be described below.

Figure 7:
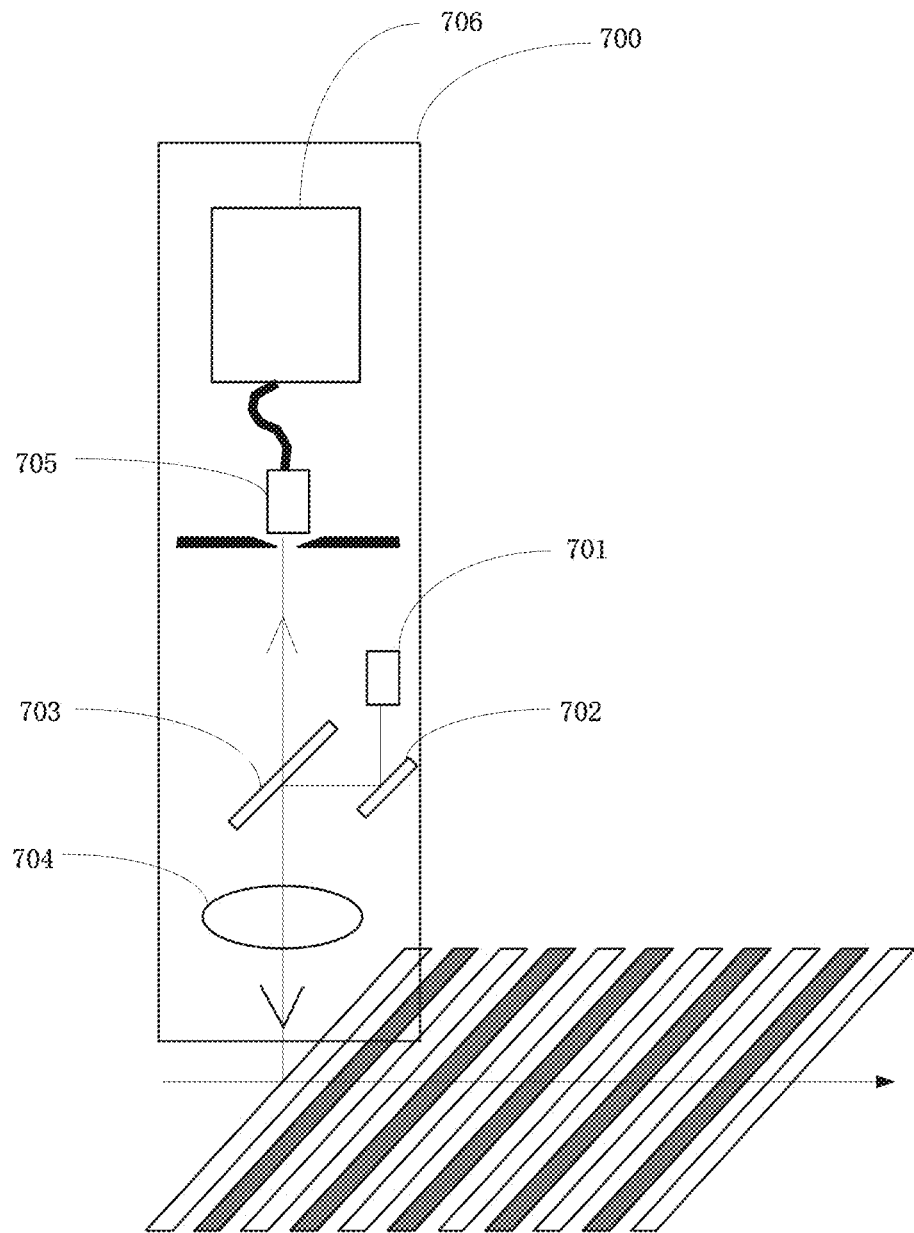
FIG. 7 is a side view in partial cross section of a structure of an optical image detection device according to one embodiment of the present disclosure.

FIG. 7 is a schematic view of a structure of a detection unit according to one embodiment of the present disclosure. Referring to FIG. 7, the detection unit may include an optical detection system 700. In one embodiment, optical detection system 700 may include a light source 701, an optional mirror 702, a semi-transparent and semi-reflective mirror (alternatively referred to as beam splitter or semi-reflective mirror hereinafter) 703, a lens 704, and a transducer (e.g., a photodiode) 705. Light source 701 may be, for example, a light emitting diode for generating light. Optional mirror 702 is configured to reflect light generated by light source 701. Semi-reflective mirror (beam splitter) 703 is configured to reflect at least one portion of light (e.g., light reflected by mirror 702) generated by light source 701 toward lens 704 to irradiate a mark on the substrate (first and second stripes 201, 202) and at least one portion of light emitted by the irradiated mark through lens 704. Lens 704 is configured to converge light from semi-reflective mirror 703 toward the mark and converge light emitted from the irradiated mark toward semi-reflective mirror 703 as an optical signal. Transducer 705 is configured to receive the optical signal through semi-reflective mirror 703 and convert the received optical signal into an electrical signal.

In one embodiment, the detection apparatus may further include a data acquisition module 706 coupled to transducer 705 and configured to acquire or obtain the electrical signal of the transducer and send the acquired or obtained electrical signal to a processing device (e.g., processing module in FIG. 3)) for processing.

The detection unit shown in FIG. 7 may be used to irradiate the detection field with light (illuminating the detection field), and the detection unit can be moved along the horizontal direction indicated by an arrow (horizontal arrow facing to the right). In general, for illuminating the detection field, light reflected of the surface of the irradiated mark back to the optical detection system has a relatively high light intensity, so that the field of view is generally well irradiated (illuminated). The illuminated detection field can recognize a mark based on the reflected light received from the surface of the mark. For marks that have no defects, light incident vertically to the marks will be substantially (or the majority of it) reflected back toward transducer (e.g., photodiode) 705, so that the detection unit can detect the marks based on the reflected light.

If the marks have defects, light incident onto the marks will be scattered, and the light intensity of the reflected light from the marks is relatively weak, so that defects of the marks can be detected. However, in this case, the presence of defects in the marks will affect, for example, the identification of the pitch between the stripes.

Figure 8:
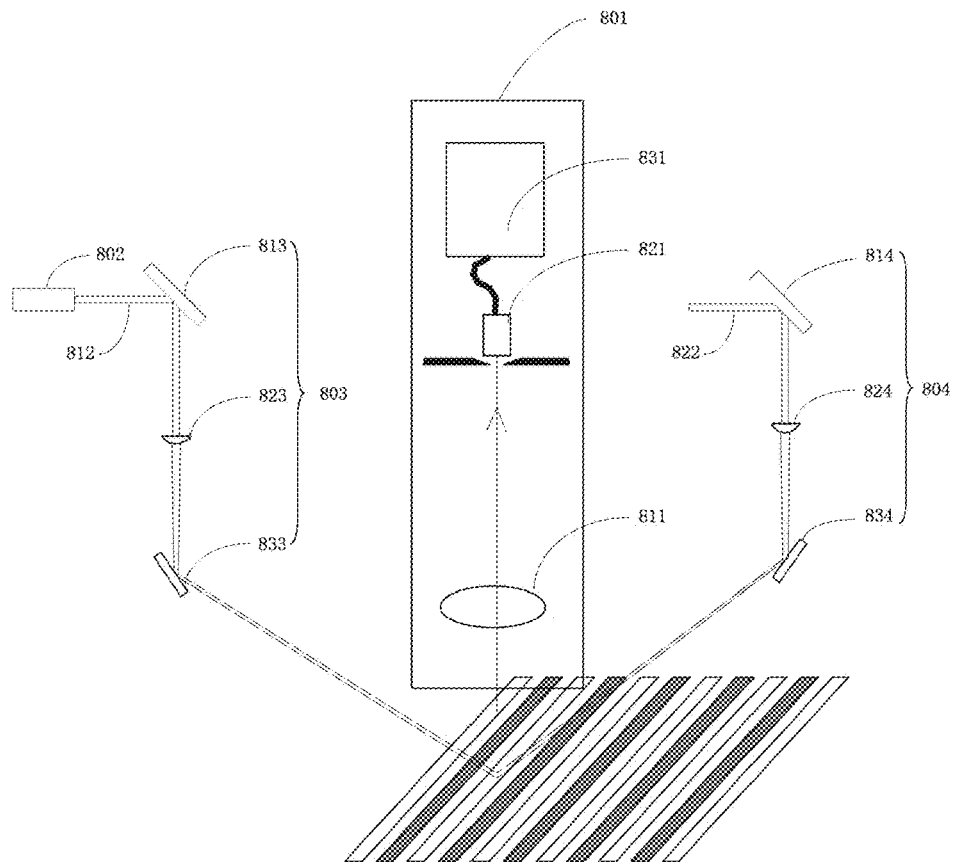
FIG. 8 is a side view in partial cross section of a structure of an optical image detection device according to another embodiment of the present disclosure.

To overcome this problem, embodiments of the present disclosure also provide another detection unit. FIG. 8 is a schematic view of a structure of a detection unit according to another embodiment of the present disclosure. Referring to FIG. 8, the detection unit may include an optical detection system 801, a light source 802, a first light generation member 803 for generating first light, a second light generation member 804 for generating second light. These components will be described in detail below.

Optical detection system 801 includes a lens 811 and a transducer 821 (e.g., a photodiode). Lens 811 is configured to converge light emitted from marks and direct the converged light to transducer 821. Transducer 821 is configured to receive the converged light and convert the received light into an electrical signal.

Light source 802 is configured to generate a first light beam 812 and a second light beam 822.

First light generation member 803 is disposed on one side of optical detection system 801 and includes a first mirror 813, a first lens 823, and a second mirror 833. First mirror 813 is configured to reflect first light beam 812. First lens 823 is configured to converge the reflected first light beam. Second mirror 833 is configured to reflect the converged first beam as a first incident light onto the marks at a first oblique angle.

Second light generation member 804 is disposed on the other side of optical detection system 801 opposite first light generation member 803 and includes a third mirror 814, a second lens 824, and a fourth mirror 834. Third mirror 814 is configured to reflect second light beam 822. Second lens 824 is configured to converge the reflected second light beam. Fourth mirror 834 is configured to reflect the converged second beam as a second incident light onto the marks at a second oblique angle. In one embodiment, the first and second oblique angles have the same oblique angle.

In one embodiment, the detection apparatus may further include a data acquisition module 831 for acquiring the electrical signal of transducer 821 and transmit the acquired electrical signal to a data processing device for further processing.

The detection unit shown in FIG. 8 can be used for dark field detection. Under normal circumstances, when the incident light irradiates the marks at an oblique angle, the optical detection system cannot receive the reflected light or can only receive a small amount of light, the field of view is generally dark and is referred to as a dark field detection. And if the marks have defects, the incident light will be scattered, and the scattered light will be condensed by the lens. The transducer will pick up the condensed light, convert it to an electrical signal, and send the electrical signal to the processing module for further processing to detect defects of the marks. Further, the symmetrical position of the first and second light beams with respect to the detection unit can reduce the adverse effects on the detection results caused by the lens distortion.

In some embodiments, the detection apparatus may be provided with the detection unit shown in FIG. 7 for detecting a defect-free mark. In some other embodiments, the detection apparatus may be provided with the detection unit shown in FIG. 8 for detecting a defective mark. In further embodiments, a portion of the detection device may be provided with the detection unit shown in FIG. 7 and another portion of the detection device may be provided with the detection unit shown in FIG. 8 so as to operate in a complementary manner.

Thus, according to embodiments of the present disclosure, defects of a mark can be detected, and if the mark has defects, the desired information (data) can still be obtained from the mark.

In some embodiments, the detection apparatus may further include a low-pass filter circuit, a voltage regulation circuit, an analog-to-digital conversion module, and a data processing unit. The low-pass filter circuit is configured to low-pass filter the analog electrical signal obtained from the transducer of FIG. 7 or FIG. 8 to remove high-frequency noises. The voltage regulation circuit is configured to regulate the filtered analog electrical signal to adapt to the input voltage level of a subsequent module. The analog-to-digital conversion module is configured to convert the regulated analog electrical signal to a digital electrical signal representative of the regulated analog electrical signal. The data processing unit is operative to determine, based on the digital electrical signal, the actual times at which the detection module starts moving and at which data is obtained from the first and second stripes. For example, the time between two adjacent stripes can be obtained by measuring the time between two falling edges or two rising edges of the digital electrical signal.

According to the different motion patterns of the detection module, data associated with the motions of the detection module may be different. Therefore, depending on the motion patterns of the detection module, different embodiments of the processing module may be used. Exemplary embodiments of the processing module will be described with reference to FIGS. 9 and 10.

Figure 9:
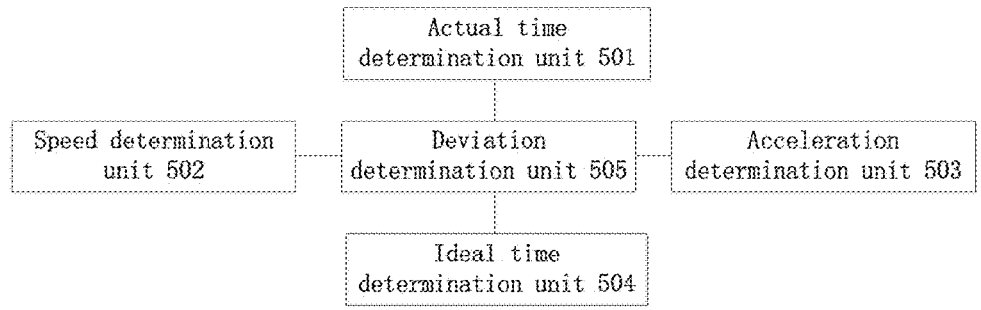
FIG. 9 is a block diagram illustrating a data processing module according to one embodiment of the present disclosure.

FIG. 9 is a block diagram illustrating a processing module 500 according to one embodiment of the present disclosure. Referring to FIG. 9, processing module 500 may include an actual time determination unit 501, a speed determination unit 502, an acceleration determination unit 503, an ideal time determination unit 504, and a deviation determination unit 505.

In the embodiment, detection module 300 is operative to move over the surface of the substrate in a certain direction (e.g., the Y direction) at a uniform deceleration. In this case, each of the different units of processing module 500 is configured to operate as follows:

Actual time determination unit 501 is configured to determine the actual times $t_{1i}$ and $t_{2i}$ when the detection module acquires data of an i-th stripe of the first stripe group and an i-th stripe of the second stripe group, where the index i is an integer greater than or equal to one.

Speed determination unit 502 is configured to determine an initial speed $v_0$ of the motion of the detection module.

Acceleration determination unit 503 is configured to determine the acceleration a of the motion of the detection module.

The initial velocity $v_0$ and acceleration a can be measured and obtained using additional measurement devices or according to the following equation:

$$X = V_0 t - \tfrac{1}{2} a t^2$$

where X is the actual distance of the placement of the detection module when the detection module moves to acquire data from the first stripe group or the second stripe group, t is the actual time when the detection module moves to acquire data from the first stripe group or the second stripe group. The initial speed $v_0$ and acceleration a can be determined based on multiple sets of data (X, t). For example, the initial speed $v_0$ and acceleration a can be determined based on multiple sets of data $(X_{1i}, t_{1i})$ of the actual distance $X_{i1}$ and the actual time $t_{1i}$ associated with the motion of the detection module when obtaining data from the first stripe.

Ideal time determination unit 504 is configured to determine the ideal time $t_{1pi}$, and $t_{2pi}$ when the detection module acquires data of the i-th first stripe and the i-th second stripe, where the index pi is an integer greater than or equal to one.

In the ideal case, the ideal distance of the placement of the detection module when the detection module moves to acquire data from the first stripe group or the second stripe group can be known in advance, and the ideal time when the detection module moves to acquire data from the first stripe group and the second stripe group can be obtained by the following equation:

$$X = V_0 t - \tfrac{1}{2} a t^2$$

where X is the ideal distance of the placement of the detection module when the detection module moves to acquire data from the first stripe or the second stripe, t is the ideal time when the detection module moves to acquire data from the first stripe and the second stripe.

Deviation determination unit 505 is configured to determine the deviation between the first stripe group and the second stripe group based on the determined actual times $t_{1i}$ and $t_{2i}$, the initial speed $v_0$, the acceleration a, and the ideal times $t_{1pi}$ and $t_{2pi}$.

For example, deviation determination unit 505 may determine the deviation between the first stripe group and the second stripe group using the following approach: first, the difference $x_1$ between the actual distance and the ideal distance from which the detection module moves from an initial position to an i-th stripe of the first stripe group is determined according to the actual time $t_{1i}$, the initial speed $v_0$, the acceleration a, and the ideal time $t_{1pi}$.

After determining the actual time $t_{1i}$ and the ideal time $t_{1pi}$, the following equation can be obtained:

$$t_{1i} = \frac{V_0}{a} - \sqrt{\left(\frac{V_0}{a} - t_{1pi}\right)^2 - \frac{2x_1}{a}}$$

The difference $x_1$ between the actual distance and the ideal distance can be obtained using multiple sets of data ($t_{1i}$, $t_{1pi}$).

Next, the difference $x_2$ between the actual distance and the ideal distance from which the detection module moves from the initial position to the i-th stripe of the second stripe group is determined according to the actual time $t_{2i}$, the initial speed $v_0$, the acceleration a, and the ideal time $t_{2pi}$.

Similarly, after determining the actual time $t_{2i}$ and the ideal time $t_{2pi}$, the following equation can be obtained:

$$t_{2i} = \frac{V_0}{a} - \sqrt{\left(\frac{V_0}{a} - t_{2pi}\right)^2 - \frac{2x_2}{a}}$$

The difference $x_2$ between the actual distance and the ideal distance can be obtained using multiple sets of data ($t_{2i}$, $t_{2pi}$).

Thereafter, the difference $\Delta x$ between $x_1$ and $x_2$ is calculated, and the difference $\Delta x$ is the deviation between the first stripe group and the second stripe group.

In one embodiment, deviation determination unit 505 may determine multiple difference values between different sets of $x_1$ and $x_2$ of each of the marks. Processing module 500 computes an average value of the deviations between the first and second stripe groups of each of the marks (i.e., average value of the difference values between the different sets of $x_1$ and $x_2$ of each of the marks). In one embodiment, processing module 500 is further configured to determine the deviation between the first stripe group and the second stripe group based on the deviation between the first stripe of the first stripe group and the corresponding first stripe of the second stripe group and the average value of the deviation between the first stripe of the first stripe group and the corresponding first stripe of the second stripe group.

If the value of $\Delta x$ is within a predetermined range, the first stripe group is considered as aligned with the second stripe group. If the value of $\Delta x$ is not within the predetermined range, the first stripe group and the second stripe group are considered to be not aligned with each other. In one embodiment, if the value of $\Delta x$ is not within the predetermined range, processing module 500 may issue an alarm and cause a subsequent alignment operation by an operator.

Figure 10:
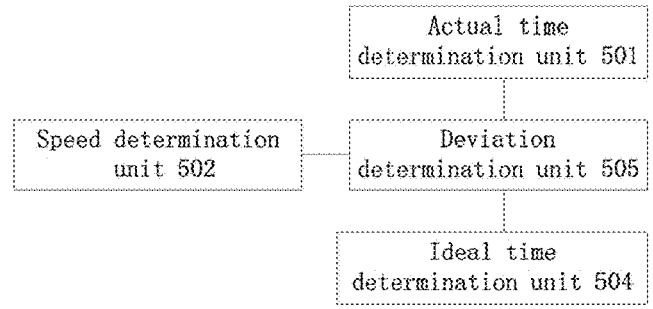
FIG. 10 is a block diagram illustrating a data processing module according to another embodiment of the present disclosure.

FIG. 10 is a block diagram illustrating a processing module 500 according to another embodiment of the present disclosure. Referring to FIG. 10, processing module 500 may include an actual time determination unit 501, a speed acquisition unit 502, an ideal time determination unit 504, and a deviation determination unit 505.

In the embodiment, detection module 300 is operative to move over the surface of the substrate in a certain direction (e.g., the Y direction) at a uniform deceleration. In this case, each of the different units of processing module 500 is configured to operate as follows:

Actual time determination unit 501 is configured to determine the actual times $t_{1i}$ and $t_{2i}$ when the detection module acquires data of the i-th stripe of the first stripe group and the i-th stripe of the second stripe group, where the index i is an integer greater than or equal to one.

Speed acquisition unit 502 is configured to acquire the speed $v_0$ of the motion of the detection module.

The velocity $v_0$ can be measured and obtained using an additional measurement device or according to the following equation:

$$X = V_0 t$$

where X is the actual distance of the placement of the detection module when the detection module moves to acquire data from the first stripe group or the second stripe group, t is the actual time when the detection module moves to acquire data from the first stripe group or the second stripe group. For example, the speed $v_0$ can be determined based on multiple sets of data ($X_{1i}$, $t_{1i}$) of the actual distance $X_{i1}$ and the actual time $t_{1i}$ associated with the motion of the detection module when obtaining data from the first stripe group.

Further, the speed $v_0$ can also be obtained in the following manner: assuming that the total length of the design of the first stripe group or the second stripe group is S, the difference between the time at which data is obtained from the last stripe of the first stripe group or the second stripe group and the time at which data is obtained from the first stripe of the first stripe group or the second stripe group is T, the ratio of S to T is the speed $v_0$.

Ideal time determination unit 504 is configured to determine the ideal times $t_{1pi}$, and $t_{2pi}$ when the detection module acquires data of the i-th stripe of the first stripe group and the i-th stripe of the second stripe group, where the index i is an integer greater than or equal to one.

In the ideal case, the ideal distance of the placement of the detection module when the detection module moves to acquire data from the first stripe group and the second stripe group is known in advance, and the ideal time when the detection module moves to acquire data from the first stripe group and the second stripe group can be obtained by the following equation:

$$X = V_0 t$$

where X is the ideal distance of the placement of the detection module when the detection module moves to acquire data from the first stripe group or the second stripe group, t is the ideal time when the detection module moves to acquire data from the first stripe group or the second stripe group.

Deviation determination unit 505 is configured to determine the deviation between the first stripe group and the second stripe group based on the actual times $t_{1i}$ and $t_{2i}$, the speed $v_0$, and the ideal times $t_{1pi}$ and $t_{2pi}$.

For example, deviation determination unit 505 may determine the deviation between the first stripe group and the second stripe group using the following approach: first, the difference $x_1$ between the actual distance and the ideal distance from which the detection module moves from an initial position to the i-th stripe of the first stripe group is determined according to the actual time $t_{1i}$, the speed $v_0$, and the ideal time $t_{1pi}$.

After determining the actual time $t_{1i}$ and the ideal time $t_{1pi}$, the following equation can be obtained:

$$t_{1i} = t_{1pi} + \frac{x_1}{V_0}$$

The difference $x_1$ between the actual distance and the ideal distance can be obtained using multiple sets of data ($t_{1i}$, $t_{1pi}$).

Next, the difference $x_2$ between the actual distance and the ideal distance from which the detection module moves from an initial position to the i-th second stripe is determined according to the actual time $t_{2i}$, the speed $v_0$, and the ideal time $t_{2pi}$.

Similarly, after determining the actual time $t_{2i}$ and the ideal time $t_{2pi}$, the following equation can be obtained:

$$t_{2i} = t_{2pi} + \frac{x_2}{V_0}$$

The difference $x_2$ between the actual distance and the ideal distance can be obtained using multiple sets of data ($t_{2i}$, $t_{2pi}$).

Thereafter, the difference $\Delta x$ between $x_1$ and $x_2$ is calculated, and the difference $\Delta x$ is the deviation between the first stripe group and the second stripe group.

If the value of $\Delta x$ is within a predetermined range, the first stripe is considered as aligned with the second stripe. If the value of $\Delta x$ is not within the predetermined range, the first stripe and the second stripe are considered to be not aligned with each other. In one embodiment, if the value of $\Delta x$ is not within the predetermined range, processing module 500 may issue an alarm and cause a subsequent alignment operation.

Figure 11:
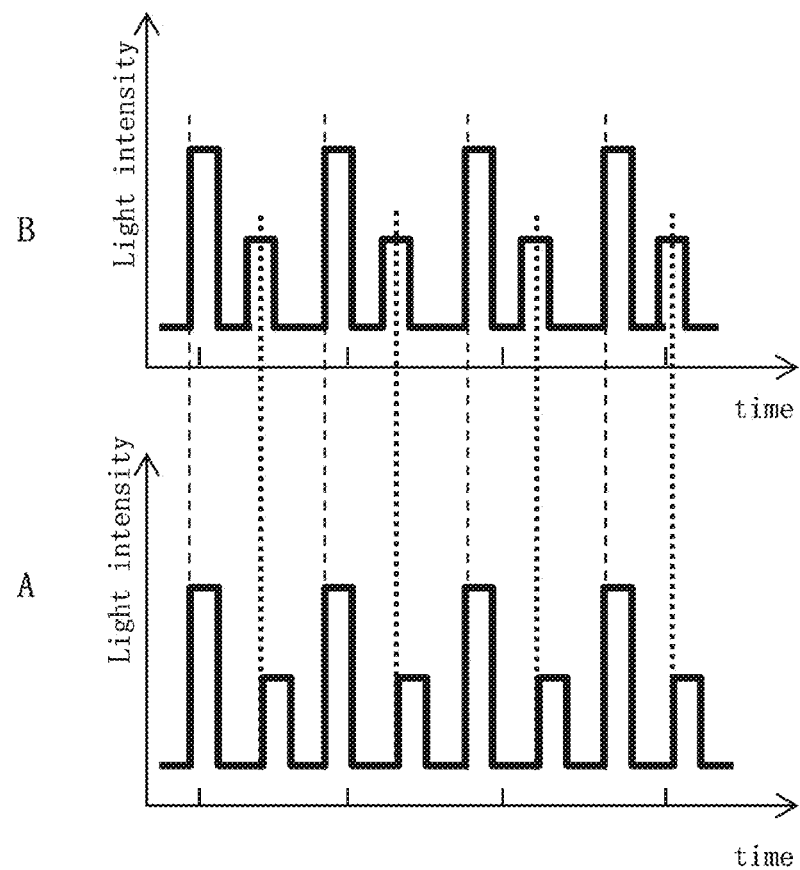
FIG. 11 is a timing diagram illustrating a measured light intensity change as a function of time according to one embodiment of the present disclosure.

FIG. 11 is a timing diagram of a graph illustrating a measured light intensity change as a function of time according to one embodiment of the present disclosure. FIG. 11 has a low portion A and a high portion B. The x-axis indicates time and the y-axis indicates the light intensity. Each of the portion A and B shows alternating signals of high amplitude and low amplitude, where the high amplitude signal is the detected light intensity of the first stripes and the low amplitude signal is the detected light intensity of the second stripes.

Referring to the portion A of FIG. 11, the deviation between the first stripe group and the second stripe group is 0 (zero). That is, the difference $x_1$ between the actual distance and the ideal distance from which the detection module moves from an initial position to the i-th stripe of the first stripe group and the difference $x_2$ between the actual distance and the ideal distance from which the detection module moves from an initial position to the i-th stripe of the second stripe group are the same. In other words, the difference between $x_1$ and $x_2$ is zero.

Referring to the portion B of FIG. 11, the deviation between the first stripe group and the second stripe group is not zero. The difference $x_1$ between the actual distance and the ideal distance from which the detection module moves from an initial position to the i-th stripe of the first stripe group shown in the portion B is the same as the difference $x_1$ shown in the portion A of FIG. 11. The difference $x_2$ between the actual distance and the ideal distance from which the detection module moves from an initial position to the i-th stripe of the second stripe group shown in portion B is different from the difference $x_2$ shown in the portion A. Therefore, the difference between $x_1$ and $x_2$ is not zero.

It will be appreciated that, although two embodiments of processing module 500 with a detection module moving at a uniform (constant) deceleration and at a uniform (constant) acceleration are described, it is understood however that these are merely examples for describing the disclosure, and the processing module may be implemented with other different embodiments. Data associated with the motion of the detection module may be obtained according to different motion patterns of the detection module for determining the deviation between the first and second stripe groups.

Embodiments of the present disclosure also provide a device for detecting a mark disposed on a substrate. The detection device may include any one of the above-described embodiments.

In one embodiment, the detection device may further include a substrate support platform for supporting the substrate. In one embodiment, the detection device may further include a shock-proof or vibration-proof platform for supporting the substrate support platform and a detection device for detecting a mark disposed on a substrate.

Embodiments of the present disclosure also provide a method for detecting a mark on a substrate. The method may be implemented using the above-described embodiments for detecting a mark on a substrate. The mark may include a plurality of first stripes (a first stripe group) and a plurality of second stripes (a second stripe group) that are arranged substantially parallel to each other and spaced apart from each other. The method may include the following steps:

Step S1: providing a substrate, which can be a silicon wafer having the above-described marks disposed thereon.

Step S2: providing a detection module. The detection module can be moved over a surface of the substrate along at least one direction (e.g., along the above-described X-direction or Y-direction). The detection module includes at least one detection unit and at least one positioning unit. The detection unit is configured to obtain data from a corresponding mark; the detection unit is also configured to be able to perform repeated acquisition operations to obtain data from the first stripes and from the second stripes, respectively. Each acquisition operation obtains data from the first stripes or from the second stripes in the corresponding mark. The positioning unit is configured to support and position a corresponding detection unit.

Step S3: operating the positioning unit to align the detection unit with a corresponding mark along a certain direction (e.g., along the Y direction).

Step S4: driving the detection module in the certain direction to detect the mark.

Step S5: determining a deviation between the first and second stripes based on the data associated with the mark and the data associated with the motion of the detection module.

In the embodiment, it is possible to substantially align the detection unit with a corresponding mark that is to be detected by operating the positioning unit, thereby driving the detection module to move over the surface of the substrate to detect a corresponding mark and obtaining the deviation between the first and second stripe groups based on the data associated with the mark and the data associated with the motion of the detection module. The method for detecting a mark according to embodiments of the present disclosure does not rely on the optical imaging technique, so that there is no need to move the mark to the center of the field of view, there is no need for a fine adjustment operation, and there is no need to identify the optical image, thereby reducing the mark detection time. The method also eliminates the high precision alignment required in the prior art approaches. Thus, the mark detection cost is reduced, and the efficiency of the mark detection and the throughput of the detection device are greatly improved.

Step S5 may be performed using different embodiments depending on the motion patterns of the detection module.

In one embodiment, the detection module moves along a certain direction at a nearly constant (uniform) deceleration. Step S5 may be performed as follows:

(1) determining the actual times $t_{1i}$ and $t_{2i}$ when the detection module acquires data of the i-th stripe of the first stripe group and the i-th stripe of the second stripe group, respectively. The index i is an integer greater than or equal to one.

(2) obtaining the initial speed $v_0$ of the detection module.

(3) determining the acceleration a of the detection module.

The initial speed $v_0$ and the acceleration a of the detection module may be obtained by measurements using additional measurement devices, or using the following equation:

$$X = V_0 t - \tfrac{1}{2} a t^2$$

where X is the actual distance of the placement of the detection module when the detection module moves to acquire data from the first stripe group or the second stripe group, t is the actual time when the detection module moves to acquire data from the first stripe group or the second stripe group. The initial speed $v_0$ and acceleration a can be determined based on multiple sets of data (X, t). For example, the initial speed $v_0$ and acceleration a can be determined based on multiple sets of data $(X_{1i}, t_{1i})$ of the actual distance $X_{i1}$ and the actual time $t_{1i}$ associated with the motion of the detection module when obtaining data from the first stripe.

(4) determining the ideal times $t_{1pi}$, and $t_{2pi}$ when the detection module acquires data of the i-th stripe of the first stripe group and the i-th stripe of the second stripe group, where the index i is an integer greater than or equal to one.

In the ideal case, the ideal distance of the placement of the detection module when the detection module moves to acquire data from the first stripe or the second stripe is known in advance, and the ideal time when the detection module moves to acquire data from the first stripe group and the second stripe group can be obtained by the following equation:

$$X = V_0 t - \tfrac{1}{2} a t^2$$

where X is the ideal distance of the placement of the detection module when the detection module moves to acquire data from the first stripe or the second stripe, t is the ideal time when the detection module moves to acquire data from the first stripe and the second stripe.

(5) determine the deviation between the first stripe and the second stripe based on the actual time $t_{1i}$ and $t_{2i}$, the initial speed $v_0$, the acceleration a, and the ideal times $t_{1pi}$, and $t_{2pi}$.

For example, the deviation between the first stripe and the second stripe may be determined using the following approach: first, the difference $x_1$ between the actual distance and the ideal distance from which the detection module moves from an initial position to the i-th stripe of the first stripe group is determined according to the actual time $t_{1i}$, the initial speed $v_0$, the acceleration a, and the ideal time $t_{1pi}$.

After determining the actual time $t_{1i}$ and the ideal time $t_{1pi}$, the following equation can be obtained:

$$t_{1i} = \frac{V_0}{a} - \sqrt{\left(\frac{V_0}{a} - t_{1pi}\right)^2 - \frac{2x_1}{a}}$$

The difference $x_1$ between the actual distance and the ideal distance can be obtained using multiple sets of data ($t_{1i}$, $t_{1pi}$).

Next, the difference $x_2$ between the actual distance and the ideal distance from which the detection module moves from an initial position to the i-th stripe of the second stripe group is determined according to the actual time $t_{2i}$, the initial speed $v_0$, the acceleration a, and the ideal time $t_{2pi}$.

Similarly, after determining the actual time $t_{2i}$ and the ideal time $t_{2pi}$, the following equation can be obtained:

$$t_{2i} = \frac{V_0}{a} - \sqrt{\left(\frac{V_0}{a} - t_{2pi}\right)^2 - \frac{2x_2}{a}}$$

The difference $x_2$ between the actual distance and the ideal distance can be obtained using multiple sets of data ($t_{2i}$, $t_{2pi}$).

Thereafter, the difference $\Delta x$ between $x_1$ and $x_2$ is calculated, and the difference $\Delta x$ is the deviation between the first stripe group and the second stripe group.

It is to be understood that the steps for determining the differences $x_1$ and $x_2$ are not strictly sequential steps. For example, the value of $x_1$ may be determined first, then the value of $x_2$ is determined. Alternatively, the value of $x_2$ may be determined first, thereafter, the value of $x_1$ is determined.

In other embodiment, the detection module moves along a certain direction at a nearly constant (uniform) acceleration. Step S5 may be performed as follows:

(1) determining the actual times $t_{1i}$ and $t_{2i}$ when the detection module acquires data of the i-th stripe of the first stripe group and the i-th stripe of the second stripe group, respectively. The index i is an integer greater than or equal to one.

(2) obtaining the speed $v_0$ of the detection module.

The speed $v_0$ of the detection module may be obtained by measurements using an additional measurement device, or using the following equation:

$$X = V_0 t$$

where X is the actual distance of the placement of the detection module when the detection module moves to acquire data from the first stripe or the second stripe, t is the actual time when the detection module moves to acquire data from the first stripe or the second stripe. For example, the speed $v_0$ can be determined based on multiple sets of data $(X_{1i}, t_{1i})$ of the actual distance $X_{i1}$ and the actual time $t_{1i}$ associated with the motion of the detection module when obtaining data from the first stripe.

(3) determining the ideal times $t_{1pi}$ and $t_{2pi}$ when the detection module acquires data of the i-th stripe of the first stripe group and the i-th stripe of the second stripe group.

In the ideal case, the ideal distance of the placement of the detection module when the detection module moves to acquire data from the first stripe group and the second stripe group is known in advance, and the ideal time when the detection module moves to acquire data from the first stripe group and the second stripe group can be obtained by the following equation:

$$X = V_0 t$$

where X is the ideal distance of the placement of the detection module when the detection module moves to acquire data from the first stripe group or the second stripe group, t is the ideal time when the detection module moves to acquire data from the first stripe group or the second stripe group, and $V_0$ is the speed of the detection module.

(4) determining the deviation between the first stripe group and the second stripe group based on the ideal time $t_{1i}$ and $t_{2i}$, the speed $v_0$, and the ideal times $t_{1pi}$, and $t_{2pi}$.

For example, the deviation between the first stripe group and the second stripe group may be determined using the following approach: first, the difference $x_1$ between the actual distance and the ideal distance from which the detection module moves from an initial position to the i-th stripe of the first stripe group is determined according to the actual time $t_{1i}$, the speed $v_0$, and the ideal time $t_{1pi}$.

After determining the actual time $t_{1i}$ and the ideal time $t_{1pi}$, the following equation can be obtained:

$$t_{1i} = t_{1pi} + \frac{x_1}{V_0}$$

The difference $x_1$ between the actual distance and the ideal distance can be obtained using multiple sets of data $(t_{1i}, t_{1pi})$.

Next, the difference $x_2$ between the actual distance and the ideal distance from which the detection module moves from an initial position to the i-th stripe of the second stripe group is determined according to the actual time $t_{2i}$, the speed $v_0$, and the ideal time $t_{2pi}$.

Similarly, after determining the actual time $t_{2i}$ and the ideal time $t_{2pi}$, the following equation can be obtained:

$$t_{2i} = t_{2pi} + \frac{x_2}{V_0}$$

The difference $x_2$ between the actual distance and the ideal distance can be obtained using multiple sets of data $(t_{2i}, t_{2pi})$.

Thereafter, the difference $\Delta x$ between $x_1$ and $x_2$ is calculated, and the difference $\Delta x$ is the deviation between the first stripe group and the second stripe group.

If the value of $\Delta x$ is within a predetermined range, the first stripe group is considered as aligned with the second stripe group. If the value of $\Delta x$ is not within the predetermined range, the first stripe group and the second stripe group are considered to be not aligned with each other. In one embodiment, if the value of $\Delta x$ is not within the predetermined range, processing module 500 may issue an alarm and cause a subsequent alignment operation by an operator.

According to embodiments of the present disclosure, the detection unit can be substantially aligned with a corresponding to be detected mark by the positioning unit, the detection module is driven to move over the surface of the substrate to detect a corresponding mark and to determine the positional deviation between the first and second stripe groups based on data associated with the mark and data associated with the motion of the detection module. The processing module determines the deviation between the first and second stripe groups based on the obtained data of the marks and the obtained data associated with the motion of the detection module. The apparatus and method for detecting a mark according to embodiments of the present disclosure does not depend on the way the marks are detected, so that there is no need to move the marks to the center of the field of view of the optical imaging system, there is no need for a fine adjustment operation, and there is no need to identify the optical image, there is no need to determine the exact location of the marks, thereby reducing the mark detection time. The apparatus and method of the present disclosure also eliminate the high precise alignment accuracy of the optical imaging systems required in the prior art. Thus, the time and equipment coast of mark detection are reduced, and the efficiency of the mark detection and the throughput of the detection device are improved.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. An apparatus for detecting a plurality of marks on a substrate, each of the marks having a first stripe group and a second stripe group spaced apart from each other and disposed in parallel to each other, the apparatus comprising:
   at least one detection module moveable over a surface of the substrate along a first direction and comprising:
      a frame;
      at least one detection unit mounted on the frame and configured to obtain data of a mark and operative to perform repeated acquisition operations on the first stripe group and the second stripe group of the mark, each of the acquisition operations acquiring data associated with the first stripe group or the second stripe group of the mark; and at least one positioning unit coupled to the at least one detection unit and configured to align the at least one detection unit with the mark in the first direction; and
a processing module configured to determine a deviation between the first stripe group and the second stripe group in response to the obtained data of the mark and data associated with a motion of the at least one detection module,
wherein the frame is configured to add a weight to the at least one detection unit to increase an inertia of the at least one detection unit in motion, and
wherein the first stripe group comprises a plurality of first stripes, and the second stripe group comprises a plurality of second stripes, the first stripes and the second stripes being spaced apart from each other and alternately arranged in the first direction, the first stripes and the second stripes having a difference in surface roughness.

2. The apparatus of claim 1, wherein
the deviation between the first stripe group and the second stripe group comprises:
a deviation between a first stripe of the first stripe group and a corresponding first stripe of the second stripe group;
an average value of the deviation between the first stripe of the first stripe group and the corresponding first stripe of the second stripe group, wherein the processing module is further configured to determine the deviation between the first stripe group and the second stripe group in response to the deviation between the first stripe of the first stripe group and the corresponding first stripe of the second stripe group and the average value of the deviation between the first stripe of the first stripe group and the corresponding first stripe of the second stripe group.

3. The apparatus of claim 1, wherein the first stripes and the second stripes have different surface heights.

4. The apparatus of claim 1, wherein the obtained data of the mark comprises a time at which the detection unit receives a peak light intensity associated with the first stripe group or the second stripe group of the mark; and
the data associated with the motion of the detection module comprises a speed of the detection module, or a speed and an acceleration of the detection module.

5. The apparatus of claim 1, wherein:
the substrate comprises a plurality of columns of the marks arranged along the first direction;
the at least one detection unit comprising a plurality of detection units;
the at least one positioning unit comprising a plurality of positioning units, each of the positioning units operative to align one of the detection units with a corresponding mark along the first direction.

6. The apparatus of claim 1, wherein
the at least one positioning unit comprises:
at least one support rod mounted to the frame and configured to support the at least one detection unit; and
a positioning mechanism configured to move the at least one detection unit along the at least one support rod to a desired position to align the at least one detection unit with a mark.

7. The apparatus of claim 6, wherein the at least one support rod comprises a screw rod, and the positioning mechanism moves the at least one detection unit along the screw rod.

8. The apparatus of claim 7, wherein:
the at least one detection unit comprises first and second holes arranged vertically with respect to each other and a third hole disposed between the first and second holes, the third hole having internal threads, and the screw rod having external threads for engaging the internal threads of the third hole;
the frame comprises a first bracket and a second bracket disposed opposite to each other;
the at least one support rod comprises a first support rail passing through the first hole and a second support rail passing through the second hole and suspended between the first and second brackets;
the screw rod passing through the third hole drives the at least one detection unit along the first and second support rails when rotated.

9. The apparatus of claim 8, further comprising an air cushion guide, the air cushion guide comprising:
a first rail extending in the first direction;
a first slider engaged with the first rail and configured to support the first bracket;
a second rail extending in the first direction; and
a second slider engaged with the second rail and configured to support the second bracket,
the first slider when moving along the first rail drives the first bracket along the first direction and the second slider when moving along the second rail drives the second bracket along the first direction, so that the at least one detection module moves above the surface of the substrate in the first direction.

10. The apparatus of claim 8, wherein the frame further comprises:
a third bracket engaged with a first end of the first bracket and a first end of second bracket; and
a fourth bracket opposite the third bracket and engaged with a second end of the first bracket and a second end of the second bracket.

11. The apparatus of claim 1, wherein the marks are disposed in a scribe line extending along the first direction; and
the marks are configured such that, when a placement error of the substrate is a first error, and a misalignment of the center of a field of view of the at least one detection unit with respect to an ideal center axis of the scribe line is a second error, the at least one detection unit is configured to obtain data from the marks disposed in the scribe line.

12. The apparatus of claim 1, wherein the at least one detection unit comprises an optical image detection system, the optical image detection system comprising:
a light source for generating light;
a lens configured to converge the light generated by the light source to irradiate the marks;
a semi-reflective mirror configured to reflect at least one portion of the converged light toward the lens to irradiate the marks and transmit at least one portion of light emitted by the irradiated marks through the lens; and
a transducer configured to receive the emitted portion of the light by the irradiated marks through the lens and convert the received emitted portion of the light into an electrical signal.

13. The apparatus of claim 1, wherein the at least one detection unit comprises an optical image detection system, the optical image detection system comprising:
a lens for converging light emitted from the marks;
a transducer for receiving light from the lens and converting the received light into an electrical signal;

a light source for generating a first light beam and a second light beam;
a first light generating member disposed on one side of the optical image detection system for generating a first light and comprising:
 a first mirror for reflecting the first light beam;
 a first lens for converging the first light beam reflected by the first mirror to generate a converged first light beam;
 a second mirror for reflecting the converged first light beam as a first light incident onto the mark at a first oblique angle;
a second light generating member disposed on one side of the optical detection image system for generating a second light and comprising:
 a third mirror for reflecting the second light beam;
 a second lens for converging the second light beam reflected by the third mirror to generate a converged second light beam; and
 a fourth mirror for reflecting the converged second light beam as a second light incident onto the mark at a second oblique angle.

14. The apparatus of claim 1, wherein the marks are etched marks, and the first stripe group comprises marks of a current layer, and the second stripe group comprises marks of a previous layer.

15. The apparatus of claim 1, wherein the at least one detection module moves over the surface of the substrate at a nearly uniform deceleration;
 the processing module comprises:
  an actual time determination unit configured to determine actual times $t_{1i}$ and $t_{2i}$ when the detection module acquires data of an i-th stripe of the first stripes and the i-th stripe of the second stripes, respectively, i being an integer greater than or equal to one;
  a speed acquisition unit configured to acquire an initial speed $v_0$ of the detection module;
  an acceleration determination unit configured to determine an acceleration a of the detection module;
  an ideal time determination unit configured to determine ideal times $t_{1pi}$ and $t_{2pi}$ when the detection module acquires data of the i-th stripe of the first stripes and the i-th stripe of the second stripes, respectively;
  a deviation determination unit configured to determine a deviation between the first stripe group and the second stripe group in response to the determined actual times $t_{1i}$ and $t_{2i}$, the initial speed $v_0$, the acceleration a, and the ideal times $t_{1pi}$ and $t_{2pi}$.

16. The apparatus of claim 15, wherein the deviation determination unit is configured to determine:
 a difference $x_1$ between an actual distance and an ideal distance from which the detection module moves from an initial position to the i-th stripe of the first stripes according to the actual time $t_{1i}$, the initial speed $v_0$, the acceleration a, and the ideal time $t_{1pi}$;
 a difference $x_2$ between an actual distance and an ideal distance from which the detection module moves from the initial position to the i-th stripe of the second stripes according to the actual time $t_{2i}$, the initial speed $v_0$, the acceleration a, and the ideal time $t_{2pi}$;
 a difference $\Delta x$ between $x_1$ and $x_2$, the difference $\Delta x$ being the deviation between the first stripe group and the second stripe group.

17. The apparatus of claim 1, wherein the at least one detection module moves over the surface of the substrate at a nearly uniform acceleration;
 the processing module comprises:
  an actual time determination unit configured to determine actual times $t_{1i}$ and $t_{2i}$ when the detection module acquires data of an i-th stripe of the first stripe group and the i-th stripe of the second stripe group, respectively, i being an integer greater than or equal to one;
  a speed acquisition unit configured to acquire a speed $v_0$ of the detection module;
  an ideal time determination unit configured to determine ideal times $t_{1pi}$ and $t_{2pi}$ when the detection module acquires data of the i-th stripe of the first stripes and the i-th stripe of the second stripes, respectively;
  a deviation determination unit configured to determine a deviation between the first stripe group and the second stripe group in response to the determined actual time $t_{1i}$ and $t_{2i}$, the speed $v_0$, and the ideal times $t_{1pi}$ and $t_{2pi}$.

18. The apparatus of claim 17, wherein the deviation determination unit is configured to determine:
 a difference $x_1$ between an actual distance and an ideal distance from which the detection module moves from an initial position to the i-th stripe of the first stripe group according to the actual time $t_{1i}$, the speed $v_0$, and the ideal time $t_{1pi}$;
 a difference $x_2$ between an actual distance and an ideal distance from which the detection module moves from an initial position to the i-th stripe of the second stripe group according to the actual time $t_{2i}$, the initial speed $v_0$, and the ideal time $t_{2pi}$;
 a difference $\Delta x$ between $x_1$ and $x_2$, the difference $\Delta x$ being the deviation between the first stripe group and the second stripe group.

19. The apparatus of claim 1, wherein the at least one detection module comprises a plurality of first detection modules and a plurality of second detection modules, the first detection modules being configured to obtain data of marks disposed in a plurality of first scribe lines in the first direction, and the second detection modules being configured to obtain data of marks disposed in a plurality of second scribe lines in a second direction perpendicular to the first direction.

20. The apparatus of claim 19, wherein the second detection modules are arranged on top of the first detection modules.

21. A method for detecting a mark on a substrate, the mark comprising a first stripe group having a plurality of first stripes and a second stripe group having a plurality of second stripes arranged in parallel to each other, the method comprising:
 providing the substrate having a plurality of layers;
 providing a detection module having at least one detection unit mounted on a frame and at least one positioning unit disposed over a surface of the substrate, the detection module being configured to move over the surface of the substrate in a first direction to obtain data of the mark and perform repeated acquisition operations on a stripe of the first stripe group or on a stripe of the second stripe group to obtain data thereof;
 aligning the at least one detection unit with the mark by the at least one positioning unit;
 operating the detection module to obtain data of the mark; and
 determining a deviation between the first stripe group and the second stripe group in response to the obtained data of the mark and data associated with a motion of the detection module, wherein the first stripes and the second stripes are alternately arranged in the first direction, the first stripes and the second stripes having a difference in surface roughness, and wherein the frame is configured to add a weight to the at least one detection unit to increase an inertia of the at least one detection unit in motion.

\* \* \* \* \*